(12) United States Patent
Ygartua

(10) Patent No.: US 7,049,844 B1
(45) Date of Patent: May 23, 2006

(54) TEST PATTERNS FOR OPTICAL MEASUREMENTS ON MULTIPLE BINARY GRATINGS

(75) Inventor: Carlos Ygartua, Palo Alto, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/007,140

(22) Filed: Dec. 8, 2004

(51) Int. Cl.
  *G01R 31/26* (2006.01)
(52) U.S. Cl. .................... 324/770; 324/158.1; 438/32
(58) Field of Classification Search .................... None
  See application file for complete search history.

(56) References Cited

U.S. PATENT DOCUMENTS 5,956,572 A * 9/1999 Kidoguchi et al. ............ 438/96

2005/0238278 A1* 10/2005 Nakashiba et al. ............ 385/14

* cited by examiner

*Primary Examiner*—Minh N. Tang
(74) *Attorney, Agent, or Firm*—Luedeka, Neely & Graham, P.C.

(57) ABSTRACT

A film stack adapted to enable optical readings on a film stack. Multiple gratings layers are disposed within transparent layers, and include a topmost grating layer, a bottommost grating layer, and at least one intervening grating layer. Each one of the grating layers have a pitch between substantially opaque portions of the grating layer and substantially transparent portions of the grating layer. The substantially opaque portions of the bottommost grating layer are laterally disposed at an offset from the substantially opaque portions of the topmost grating layer. The substantially opaque portions of the at least one intervening grating layer are laterally disposed between the opaque portions of the bottommost grating layer and the substantially opaque portions of the topmost grating layer.

20 Claims, 2 Drawing Sheets

TEST PATTERNS FOR OPTICAL MEASUREMENTS ON MULTIPLE BINARY GRATINGS

FIELD

This invention relates to the field of integrated circuit fabrication. More particularly, this invention relates to optical measurement of the layers that are formed during the integrated circuit fabrication process.

BACKGROUND

As used herein, the term "integrated circuits" generally refers to monolithic semiconducting devices, such as those formed of group IV materials like silicon or germanium or mixtures thereof, or group III-V compounds such as gallium arsenide. The term includes all types of devices formed, such as memory and logic, and all designs of such devices, such as MOS and bipolar. The term also comprehends applications such as flat panel displays, solar cells, and charge coupled devices.

Integrated circuits are formed of many layers of different materials, which layers are patterned so as to form desired structures that interact with one another according to predetermined designs. Thus, it is of vital importance that many of these layers be formed to very exacting tolerances, such as in their shape, thickness, and composition. If the various structures so formed during the integrated circuit fabrication process are not precisely formed, then the integrated circuit tends to not function in the intended manner, and may not function at all.

Because the layers of which integrated circuits are formed are so thin and patterned to be so small, they cannot be inspected without the aid of instrumentation. Any improvement in the speed at which such instrumentation can take its readings is of benefit to the industry, as such speed enhancements tend to reduce the production bottlenecks at inspection steps, or alternately allow for the inspection of a greater number of integrated circuits at such inspection steps.

Spectral ellipsometers and dual beam spectrophotometers are typically used to measure properties such as thickness and refractive index of individual layers within a multilayered film stack. Such instruments work by directing one or more beams of light toward the surface of the film stack, and then sensing the properties of the light as it is variously reflected off of the different surfaces of the individual layers within the film stack. By adjusting the properties of the incident beam of light, and detecting the associated changes in the reflected beam of light, the properties of the film stack, such as the materials of which the various layers are formed and thicknesses to which they are formed, can be determined.

This film measurement process can be broken down into two basic steps, being 1) the measurement of the properties of the reflected light beam, and 2) the mathematical fitting of computed reflectance property values based on some theoretical model to the measured results attained in step 1. Step 2 typically consists of the iterated steps of computing one or more theoretical value by plugging estimates of the film stack parameters, such as thickness and refractive index, into the model film stack equations, comparing the theoretical values obtained to the actual measured property values of the reflected beam of light, and if the theoretical values and the measured values do not agree to within a desired tolerance, then adjusting the estimated film stack parameters and recomputing the theoretical values.

This process is performed again and again, each time making some adjustment to the estimated film stack parameters that are fed into the model, until the theoretical values computed by the model agree with the actual measured values within the desired precision limits. When this agreement is attained, then there is some confidence that the estimated film stack parameters that were used to produce the theoretical values are very nearly the same as the actual film stack parameters.

For many film stacks, the step of iterative computing as described above consumes by far the most time during the process. For some film stacks, such as those film stacks that contain patterned lines, referred to as grating layers herein, this iterative steps becomes extremely complex, because of the tremendous overhead of computing and tracking reflections at multiple diffracting angles. When several grating layers are buried within multiple layers, the process becomes even more complex.

What is needed, therefore, is a method of spectral film stack measurement that tends to reduce at least some of the problems described above.

SUMMARY

The above and other needs are met by a film stack adapted to enable optical readings on the film stack. Multiple gratings layers are disposed within transparent layers, and include a topmost grating layer, a bottommost grating layer, and at least one intervening grating layer. Each one of the grating layers have a pitch between substantially opaque portions of the grating layer and substantially transparent portions of the grating layer. The substantially opaque portions of the bottommost grating layer are laterally disposed at an offset from the substantially opaque portions of the topmost grating layer. The substantially opaque portions of the at least one intervening grating layer are laterally disposed between the opaque portions of the bottommost grating layer and the substantially opaque portions of the topmost grating layer.

In this manner, the offset between the grating layers tends to reduce transmittance and reflectance of the light that is used to take the readings on the film stack, and the resultant spectra produced and the model of the film stack is dramatically simplified. This simplification enables the readings to be more repeatable, and also enables the readings to be taken more quickly.

In various embodiments, the offset is about one-quarter of the pitch, or is no more than about one-quarter of the pitch. The opaque portions of the at least one intervening layer in various embodiments: (1) are laterally disposed equally between the opaque portions of the bottommost grating layer and the substantially opaque portions of the topmost grating layer; (2) comprise a plurality of intervening grating layers, and the substantially opaque portions of the plurality of intervening grating layers are substantially evenly laterally disposed between the opaque portions of the bottommost grating layer and the substantially opaque portions of the topmost grating layer; or (3) comprise a plurality of intervening grating layers, and the substantially opaque portions of the plurality of intervening grating layers are substantially laterally disposed between the opaque portions of the bottommost grating layer and the substantially opaque portions of the topmost grating layer according to depths of the plurality of intervening grating layers within the film stack. Preferably, the substantially opaque portions comprise metal lines, and the substantially transparent portions comprise non electrically conductive materials. An integrated circuit including the film stack recited above is also described.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figures 1, 2, 3:
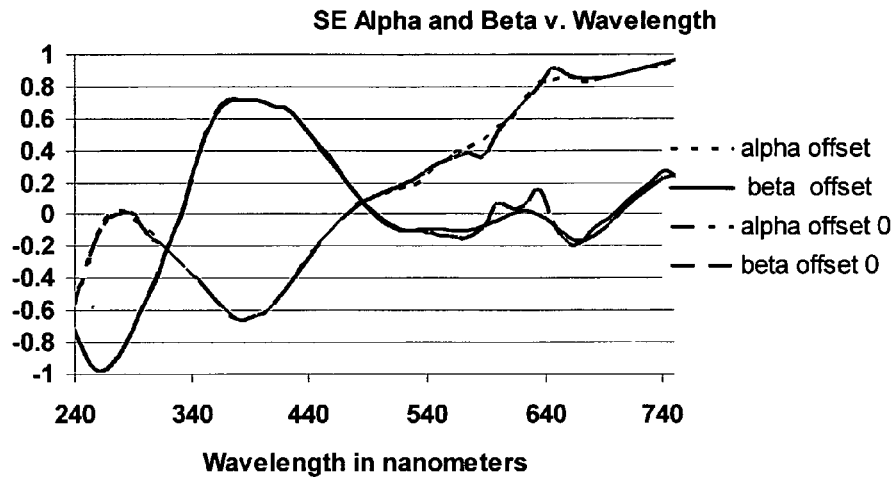
FIG. 1 is a chart depicting how a spectral response is simplified by a film stack according to the present invention.
FIG. 2 is a summary of values for a film stack that does not utilize the offset of the present invention.
FIG. 3 is a summary of values for a film stack that utilizes offsets according to the present invention.

One purpose of the invention is to reduce the complexity of measured spectroscopic ellipsometric spectra or reflectance spectra from thin film stacks formed on multiple layers of diffraction gratings (periodic thin film structures), by reducing and preferably minimizing the reflected light from grating layers below the topmost grating layer. The process by which the theoretical model is fitted to the measured optical data (the measurement algorithm) is thus simplified. This improves the efficiency and reliability of the optical measurement (thickness and refractive index) of the thin film (or thin film stack).

The typical diffraction grating layer is a binary grating. A binary grating is formed by periodic lines of metal separated by dielectric regions. A multi-level interconnect via film stack used in integrated circuit fabrication is an example of a multiple layer binary grating. A test pattern for optical measurements according to the present invention reduces and preferably minimizes the effects (reflected light) of grating layers below the topmost grating layer by an appropriate lateral shifting of the grating layers in relation to each other. For a given set of grating layers (with a continuous film stack on top) a set of desired and preferably optimum lateral shifts (offsets) can be calculated. A grating layer is defined by the refractive index of each region, the thickness of the layer, the repeat distance (pitch), the relative size of each region (space ratio), and the offset.

By contrast, a standard integrated circuit film stack is designed such that the dielectric and metal regions of the grating layers are aligned (offset=0). This generally allows for the maximum amount of light to be reflected from each layer, and therefore adds complexity to the measured spectra, the corresponding model, and the measurement algorithm. The complexity added to the measurement algorithm is associated, at least in part, with fitting spectral features associated with the deeper grating layers in the film stack. This decreases the efficiency of the measurement since more variables (in the model) need to be solved by the measurement algorithm. Reliability is generally decreased if the added variables correlate with the variables associated with the thin films to be measured. An increase in correlation (trade-off) between variables generally causes a decrease in the measurement precision and repeatability performance. The optimized film stack according to the present invention reduces and preferably minimizes these problems.

For a given film stack there is preferably a set of optimum offsets for the grating layers. For a film stack with four to five grating layers (of total thickness between about eight hundred nanometers and one thousand nanometers) and a nominal pitch and space ratio of about six hundred nanometers and about three hundred nanometers respectively, a set of offsets with a maximum of about one-quarter of the pitch tends to the optimum. The maximum offset is preferably applied to the bottom grating layer, relative to the topmost grating layer. The offsets of the intervening grating layers preferably decrease (approximately) in proportion to the buried thickness, such that the topmost grating layer preferably has an offset of zero. In this case, the optimization of the test pattern results in significant spectral smoothing (about a seventy-five percent reduction in the envelope size for small local mimima and maxima) for wavelengths in the range of from about five hundred nanometers to about eight hundred nanometers.

Typically, the ratio of dielectric to metal (space ratio) for a binary grating layer is less than about fifty percent at the surface. Below the surface, the space ratio can be larger. Since the dielectric is essentially transparent, a larger space ratio allows more light to be transmitted (and reflected back) through the grating layer. If the grating layer is shifted (by a fraction of the pitch) in the direction of the grating, or in other words, perpendicular to the length of the metal lines, the amount of light transmitted by that layer is generally reduced. For a multiple layer binary grating, if a gradient is applied to the shifts (offsets) of each grating layer, the measured spectra tends to have simpler features.

FIG. 1 shows an example of the effect of offsets on the spectra, FIG. 2 shows the measurement results for a film stack with offsets equal to zero, and FIG. 3 shows the measurement results for a film stack with offsets applied as described herein.

The offset decreases from 0.1698 to 0.0171 with increasing layer number. The spectra with offsets applied is clearly more simple (having fewer sharp features as depicted in FIG. 1) for wavelengths even down to about two hundred and forth nanometers, and more especially for wavelengths greater than about four hundred nanometers. Optimum offset gradients are preferably determined by simulation on a case by case basis. In this example, the maximum offset is about one-quarter of the pitch. The gradient in the offset is such that the offset is near zero for layer four, as listed in the dialog box of FIG. 3. Layer five represents the bulk of the top grating layer. Layer six is an approximation for the surface. Layer seven is the continuous thin film that is to be measured (thickness and refractive index), such as may be formed of silicon carbide.

Figure 4:
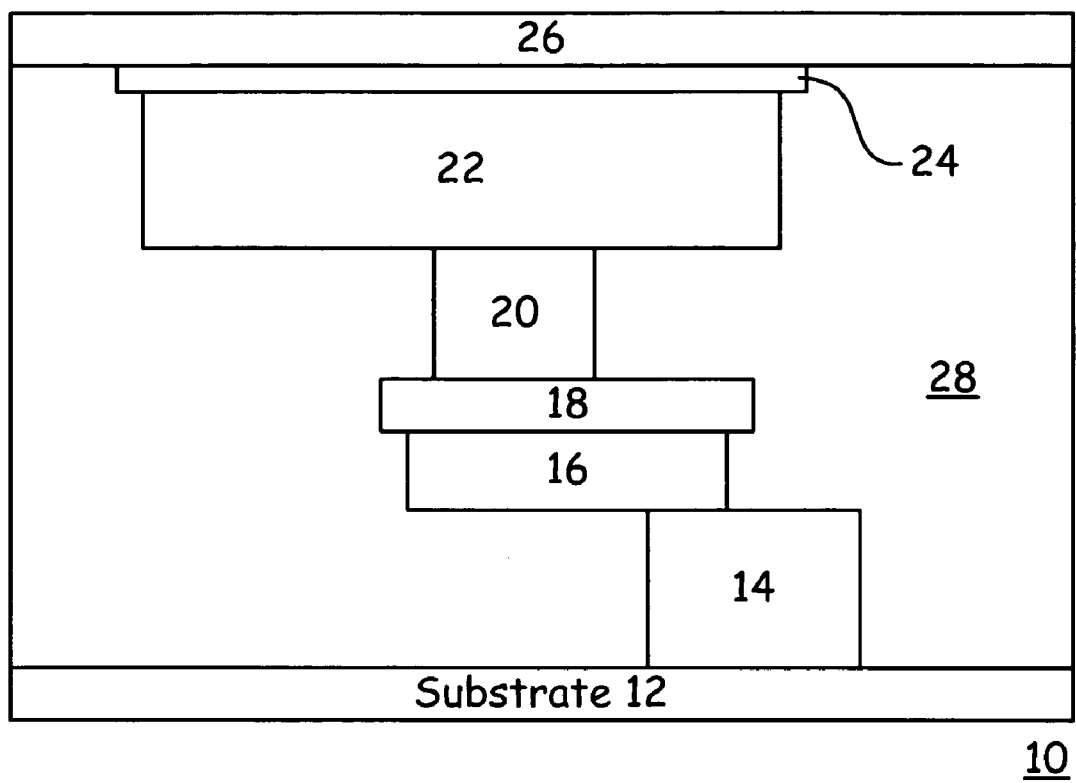
FIG. 4 is a cross section al representation of a film stack including grating layers that utilized offsets according to the present invention.

FIG. 4 depicts a cross sectional representation of a portion of an integrated circuit 10, with a multiple grating layer film stack with offsets, with the parameters as given in the table of FIG. 3. As depicted, the film stack is embedded in oxide layers 28, the individual strata of which are not depicted so as to reduce distracting detail in the drawing. The film stack preferably starts with connections to the substrate 12, such as integrated circuit structures formed in a silicon substrate. Elements 14, 16, 18, 20, 22, and 24 preferably represent electrically conductive materials, such as copper elements. Thus, these elements 14, 16, 18, 20, 22, and 24 are grating layers as described herein.

The layers 14, 16, 18, 20, 22, and 24 as depicted in FIG. 4 represent the layers designated as 1–6, respectively, in the dialog box depicted in FIG. 3. Thus, the thickness in angstroms is given in FIG. 3 for each layer depicted in FIG. 4, as well as the roughness in angstroms, the space ration, the pitch in microns, and the offset in microns. Thus, the film stack depicted in FIG. 4 represents a film stack that has been designed with the offsets as described herein, which reduce the complexity of the calculations used to determine the properties of the layers of the integrated circuit 10.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A film stack adapted to enable optical readings on the film stack, the film stack comprising:
    multiple gratings layers disposed within transparent layers, including a topmost grating layer, a bottommost grating layer, and at least one intervening grating layer, each one of the grating layers having a pitch between substantially opaque portions of the grating layer and substantially transparent portions of the grating layer,
    the substantially opaque portions of the bottommost grating layer laterally disposed at an offset from the substantially opaque portions of the topmost grating layer, and the substantially opaque portions of the at least one intervening grating layer laterally disposed between the opaque portions of the bottommost grating layer and the substantially opaque portions of the topmost grating layer.

2. The film stack of claim 1, wherein the offset is about one-quarter of the pitch.

3. The film stack of claim 1, wherein the offset is no more than about one-quarter of the pitch.

4. The film stack of claim 1, wherein the opaque portions of the at least one intervening layer are laterally disposed equally between the opaque portions of the bottommost grating layer and the substantially opaque portions of the topmost grating layer.

5. The film stack of claim 1, wherein the at least one intervening grating layer comprises a plurality of intervening grating layers, and the substantially opaque portions of the plurality of intervening grating layers are substantially evenly laterally disposed between the opaque portions of the bottommost grating layer and the substantially opaque portions of the topmost grating layer.

6. The film stack of claim 1, wherein the at least one intervening grating layer comprises a plurality of intervening grating layers, and the substantially opaque portions of the plurality of intervening grating layers are substantially laterally disposed between the opaque portions of the bottommost grating layer and the substantially opaque portions of the topmost grating layer according to depths of the plurality of intervening grating layers within the film stack.

7. The film stack of claim 1, wherein the substantially opaque portions comprise metal lines.

8. The film stack of claim 1, wherein the substantially transparent portions comprise non electrically conductive materials.

9. An integrated circuit, the improvement comprising the film stack of claim 1.

10. An integrated circuit, the improvement comprising a film stack adapted to enable optical readings on the film stack, the film stack comprising:
    multiple gratings layers disposed within transparent layers, including a topmost grating layer, a bottommost grating layer, and at least one intervening grating layer, each one of the grating layers having a pitch between substantially opaque portions of the grating layer and substantially transparent portions of the grating layer,
    the substantially opaque portions of the bottommost grating layer laterally disposed at an offset from the substantially opaque portions of the topmost grating layer, and the substantially opaque portions of the at least one intervening grating layer laterally disposed between the opaque portions of the bottommost grating layer and the substantially opaque portions of the topmost grating layer,
    wherein the offset is no more than about one-quarter of the pitch.

11. The integrated circuit of claim 10, wherein the offset is about one-quarter of the pitch.

12. The integrated circuit of claim 10, wherein the opaque portions of the at least one intervening layer are laterally disposed equally between the opaque portions of the bottommost grating layer and the substantially opaque portions of the topmost grating layer.

13. The integrated circuit of claim 10, wherein the at least one intervening grating layer comprises a plurality of intervening grating layers, and the substantially opaque portions of the plurality of intervening grating layers are substantially evenly laterally disposed between the opaque portions of the bottommost grating layer and the substantially opaque portions of the topmost grating layer.

14. The integrated circuit of claim 10, wherein the at least one intervening grating layer comprises a plurality of intervening grating layers, and the substantially opaque portions of the plurality of intervening grating layers are substantially laterally disposed between the opaque portions of the bottommost grating layer and the substantially opaque portions of the topmost grating layer according to depths of the plurality of intervening grating layers within the film stack.

15. The integrated circuit of claim 10, wherein the substantially opaque portions comprise metal lines.

16. The integrated circuit of claim 10, wherein the substantially transparent portions comprise non electrically conductive materials.

17. An integrated circuit, the improvement comprising a film stack adapted to enable optical readings on the film stack, the film stack comprising:
    multiple gratings layers disposed within transparent layers, including a topmost grating layer, a bottommost grating layer, and a plurality of intervening grating layers, each one of the grating layers having a pitch between substantially opaque portions of the grating layer and substantially transparent portions of the grating layer,
    the substantially opaque portions of the bottommost grating layer laterally disposed at an offset from the substantially opaque portions of the topmost grating layer, and the substantially opaque portions of the at least one intervening grating layer laterally disposed between the opaque portions of the bottommost grating layer and the substantially opaque portions of the topmost grating layer, wherein the offset is no more than about one-quarter of the pitch, wherein the substantially opaque portions of the plurality of intervening grating layers are substantially laterally disposed between the opaque portions of the bottommost grating layer and the substantially opaque portions of the topmost grating layer according to depths of the plurality of intervening grating layers within the film stack.

18. The integrated circuit of claim 17, wherein the offset is about one-quarter of the pitch.

19. The integrated circuit of claim 17, wherein the substantially opaque portions comprise metal lines.

20. The integrated circuit of claim 17, wherein the substantially transparent portions comprise non electrically conductive materials.

* * * * *